United States Patent
Lim et al.

(10) Patent No.: US 11,665,952 B2
(45) Date of Patent: May 30, 2023

(54) APPARATUS FOR MANUFACTURING DISPLAY DEVICE AND METHOD FOR MANUFACTURING DISPLAY DEVICE

(71) Applicant: Samsung Display Co., Ltd., Yongin-si (KR)

(72) Inventors: Jong Hee Lim, Cheonan-si (KR); Jae Il Kim, Asan-si (KR); Jong Hyup Kim, Incheon (KR); Kang Hyuk Lee, Yongin-si (KR); Jin Pyung Lee, Pohang-si (KR); Il Young Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 40 days.

(21) Appl. No.: 17/222,877

(22) Filed: Apr. 5, 2021

(65) Prior Publication Data

US 2021/0336237 A1 Oct. 28, 2021

(30) Foreign Application Priority Data

Apr. 22, 2020 (KR) ........................ 10-2020-0048601

(51) Int. Cl.
*H10K 71/00* (2023.01)
*H01L 51/56* (2006.01)

(52) U.S. Cl.
CPC .................................... *H01L 51/56* (2013.01)

(58) Field of Classification Search
CPC ............................ B23K 2101/36; H01L 51/56
See application file for complete search history.

(56) References Cited

U.S. PATENT DOCUMENTS

| 8,487,209 B2 | 7/2013 | Sakamoto et al. | |
| 2008/0238957 A1* | 10/2008 | Hayashi | B41J 2/175 347/85 |
| 2008/0239029 A1* | 10/2008 | Hayashi | B41J 2/17513 347/3 |
| 2008/0297550 A1* | 12/2008 | Igarashi | B41J 2/2132 347/12 |
| 2009/0033700 A1* | 2/2009 | Kusumoto | B41J 2/175 347/12 |

(Continued)

FOREIGN PATENT DOCUMENTS

| JP | 2004-001043 | 1/2004 |
| JP | 2007-268610 | 10/2007 |

(Continued)

*Primary Examiner* — Caleb E Henry
(74) *Attorney, Agent, or Firm* — H.C. Park & Associates, PLC

(57) ABSTRACT

An apparatus for manufacturing a display device includes: a stage unit; and a suction unit located above the stage unit, wherein the suction unit includes: a main body including an outer box with top and bottom openings and an inner cup disposed in the outer box; a first air blower disposed above the main body and including a first main pipe extending in a first direction and a second air blower including a second main pipe extending in a second direction intersecting the first direction; a lower plate coupled to a lower end of the outer box and including a through hole; and a suction inlet defined by an inner end of the lower plate defining the through hole and a lower end of the inner cup, wherein the suction inlet is opened downward.

12 Claims, 15 Drawing Sheets

(56) References Cited

U.S. PATENT DOCUMENTS

| | | | |
|---|---|---|---|
| 2009/0058915 A1* | 3/2009 | Hayashi | B41J 2/175 347/17 |
| 2009/0058925 A1* | 3/2009 | Hayashi | B41J 2/16532 347/30 |
| 2018/0233707 A1* | 8/2018 | Mine | H01L 21/67173 |

FOREIGN PATENT DOCUMENTS

| | | |
|---|---|---|
| KR | 10-2018-0065599 | 6/2018 |
| KR | 10-1882186 | 7/2018 |
| KR | 10-2019-0095625 | 8/2019 |

* cited by examiner

APPARATUS FOR MANUFACTURING DISPLAY DEVICE AND METHOD FOR MANUFACTURING DISPLAY DEVICE

CROSS-REFERENCE TO RELATED APPLICATION

This application claims priority from and the benefit of Korean Patent Application No. 10-2020-0048601 filed on Apr. 22, 2020, which is hereby incorporated by reference for all purposes as if fully set forth herein.

BACKGROUND

Field

Embodiments of the invention relate generally to display devices, and, more particularly, to an apparatus for manufacturing a display device and a method for manufacturing a display device.

Discussion of the Background

The importance of display devices has steadily increased with the development of multimedia technology. Accordingly, various types of display devices such as an organic light emitting display (OLED), a liquid crystal display (LCD) and the like have been used.

A display panel constituting the display device is formed by cutting a cell-based substrate formed from a parent substrate, and during this cutting process, fine particles or fumes may be generated.

The above information disclosed in this Background section is only for understanding of the background of the inventive concepts, and, therefore, it may contain information that does not constitute prior art.

SUMMARY

Applicant discovered that the fine particles or fumes generated during cutting a parent substrate to form a cell substrate may be adsorbed in what will become a pad portion of the display panel and may cause a contact failure of the pad portion.

Apparatuses for manufacturing display devices and methods for manufacturing same according to the principles and implementations of the invention can effectively remove fumes that may be generated during a substrate cutting process or that may be generated in a display panel. During the cutting process, fumes may be generated, and the fumes may interfere with the cutting process by causing a phenomenon that blocks the laser beam. An embodiment of an apparatus for manufacturing a display device includes a stage unit; and a suction unit located above the stage unit, wherein the suction unit comprises: a main body including an outer box with top and bottom openings and an inner cup disposed in the outer box; a first air blower disposed above the main body and including a first main pipe extending in a first direction and a second air blower including a second main pipe extending in a second direction intersecting the first direction; a lower plate coupled to a lower end of the outer box and including a through hole; and a suction inlet defined by an inner end of the lower plate defining the through hole and a lower end of the inner cup, wherein the suction inlet is opened downward.

An embodiment of a method for manufacturing a display device includes placing a target substrate on a stage unit; and irradiating a laser beam onto the target substrate along a cutting line to cut the target substrate, injecting air from the top toward the cutting line of the target substrate, and sucking the air at an outside of the cutting line.

An apparatus according to some implementations may prevent such a phenomenon by including a blower for injecting fluid toward the target substrate and a suction inlet opened downwardly. For example, it is possible to uniformly and efficiently remove fumes generated in a target substrate by injecting air with an air blower embodiment, and to uniformly and efficiently remove fumes generated in a target substrate by injecting air with an air blower.

Additional features of the inventive concepts will be set forth in the description which follows, and in part will be apparent from the description, or may be learned by practice of the inventive concepts.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
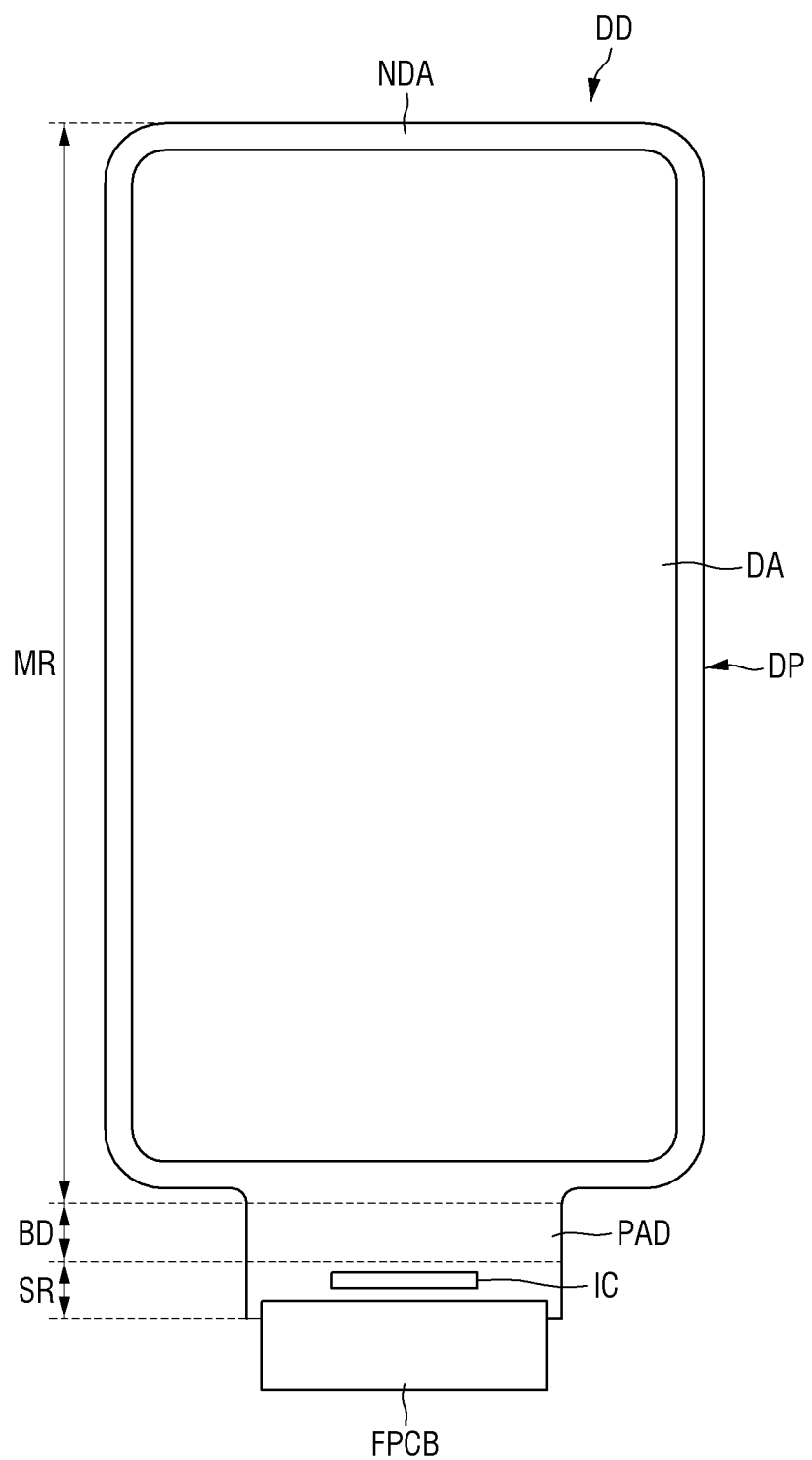
FIG. 1 is a plan view illustrating an embodiment of a display device constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z—axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly. As used herein, "top edge," "bottom edge," "left edge," and "right edge" of a display panel or the like refer to edges or ends respectively located on the top, bottom, left, and right sides of the display panel, or the like in plan view. It should be understood that a direction mentioned in an embodiment refers to a relative direction and the embodiments are not limited to the direction mentioned.

The terminology for embodiments used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
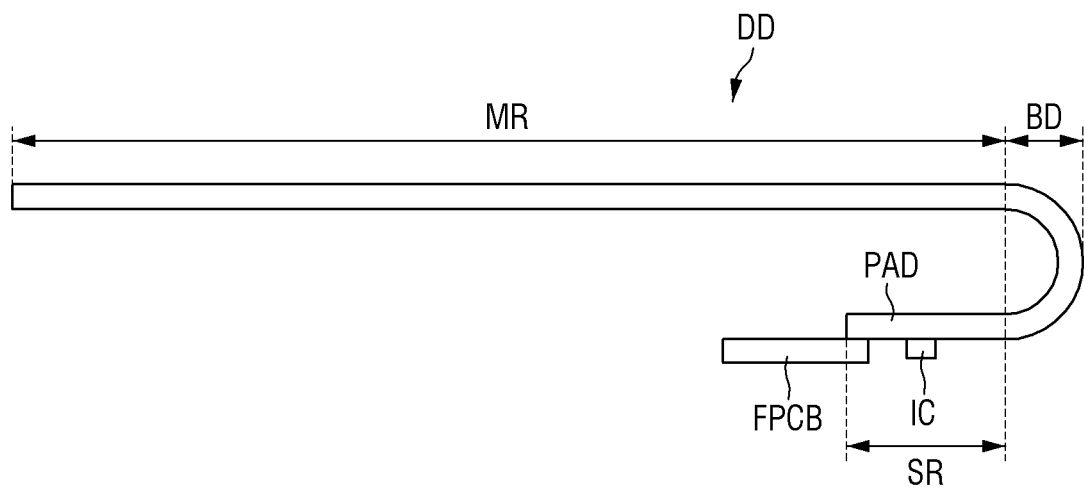
FIG. 2 is a schematic partial cross-sectional view of the display device embodiment of FIG. 1.

FIG. 1 is a plan view illustrating an embodiment of a display device constructed according to embodiment principles of the invention. FIG. 2 is a schematic partial cross-sectional view of the display device embodiment of FIG. 1.

In the plan view of FIG. 1, top, bottom, left, and right directions are defined for simplicity of description. A top-bottom direction is a vertical direction or a column direction, and a left-right direction is a horizontal direction or a row direction.

Referring to FIGS. 1 and 2, a display device DD is a device for displaying a moving image or a still image. The display device DD may be used as a display screen of various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs). The display device DD may be, for example, an organic light emitting display device, a plasma display device, a field emission display device, an electrophoretic display device, a quantum dot light emitting display device, a micro LED display device, or the like. Hereinafter, an organic light emitting display device is described as an example of the display device, but the embodiments are not limited thereto.

The display device DD may include a display panel DP. The display panel DP may include a generally flexible substrate including a generally flexible polymer material such as a polyimide. Accordingly, the display panel DP can be bent, folded or rolled.

The display panel DP may include a main region MR and a bending region BD connected to one side of the main region MR. The display panel DP may further include a sub-region SR which is connected to the bending region BD and overlaps the main region MR in a thickness direction.

The main region MR may have a generally rectangular shape with four rounded corners. An edge curved portion of the main region MR may form an external appearance of the display device DD. The bending region BD and the sub-region SR may have smaller widths than the main region MR. A generally L-shaped cut region may be formed in a portion where the main region MR and the bending region BD are connected to each other. By forming the generally L-shaped cut region, the display panel DP may be easily bent while maintaining the external appearance of the display panel DP. The generally planar shape of the above-described display panel DP may be formed by cutting a cell-based substrate formed from a parent substrate.

In the display panel DP, when a portion displaying a screen is defined as a display area DA and a portion not displaying a screen is defined as a non-display area NDA, the display area DA of the display panel DP is located in the main region MR. The remaining portion except for the display area DA becomes the non-display area NDA of the display panel DP. In some embodiments, a peripheral edge portion of the display area DA in the main region MR, the entire bending region BD, and the entire sub-region SR may be the non-display area NDA. However, the embodiments are not limited thereto, and the bending region BD and/or the sub-region SR may also include the display area DA.

The main region MR may have a shape substantially similar to an outer shape of the display device DD in plan view. The main region MR may be a generally flat region located on one plane. However, the embodiments are not limited thereto, and at least one edge of the remaining edges except an edge (side) of the main region MR connected to the bending region BD may be bent in a generally curved shape or bent in a vertical direction.

The display area DA of the display panel DP may be disposed at the center of the main region MR. The display area DA may include a plurality of pixels. The display area DA may have a generally rectangular shape or a generally rectangular shape with rounded corners. However, the embodiments are not limited thereto, and the display area DA may have various shapes such as a generally square shape, other polygons, such as a generally circular shape, a generally elliptical shape or the like.

If at least one of the edges other than the edge of the main region MR connected to the bending region BD is curved or bent, the display area DA may also be disposed on the corresponding edge. However, the embodiments are not limited thereto, and the non-display area NDA that does not display a screen may be disposed on the generally curved or bent edge. Alternatively, both the display area DA and the non-display area NDA may be disposed thereon.

The non-display area NDA may be located around the display area DA in the main region MR. The non-display area NDA of the main region MR may be placed in an area from the outer boundary of the display area DA to the edge of the display panel DP. Signal lines or driving circuits may be disposed in the non-display area NDA of the main region MR to apply a signal to the display area DA. Further, the outermost black matrix may be disposed in the non-display area NDA of the main region MR, but the embodiments are not limited thereto.

The bending region BD may be disposed between the main region MR and the sub-region SR, and at least one of two outlines thereof may include a generally curved portion. For example, in the bending region BD, the two outlines connecting one side of the main area MR to one side of the sub area SR may be generally curved portions having substantially the same curvature. The distance between the two outlines may decrease as going from the main region MR to the sub region SR.

In the bending region BD, the display panel DP may be bent with a generally curvature downward in a thickness direction, i.e., in a direction opposite to a display surface. The bending region BD may have a substantially constant radius of curvature. However, the embodiments are not limited thereto, and the bending region BR may have a different radius of curvature for each section. The surface of the display panel DP is reversed as the display panel DP is bent in the bending region BD. In other words, one surface of the display panel DP facing upward may be changed to face outward through the bending region BD and then to face downward.

The sub-region SR extends from the bending region BD. The sub-region SR may extend in a direction substantially parallel to the main region MR from a point where bending is completed. The sub-region SR may overlap the main region MR in the thickness direction of the display panel DP. The sub-region SR may overlap the non-display area NDA of the edge of the main region MR and further overlap the display area DA of the main region MR. The width of the sub-region SR may be substantially the same as the width of the bending region BD, but the embodiments are not limited thereto.

A driving chip IC may be disposed on the sub-region SR of the display panel DP. The driving chip IC may include an integrated circuit for driving the display panel DP. In some embodiments, the integrated circuit may be, but is not limited to, a data driving integrated circuit that generates and provides a data signal. The driving chip IC may be mounted on the display panel DP in the sub-region SR. The driving chip IC, which is mounted on one surface of the display panel DP which is the same surface as the display surface, may be mounted on the surface of the display panel DP facing downward in the thickness direction as the bending region BD is bent and reversed as described above such that the upper surface of the driving chip IC faces downward. The driving chip IC may be attached onto the display panel DP through an anisotropic conductive film or through ultrasonic bonding. As described above, during a cutting process for forming the display panel DP, fine particles or fumes may be generated. The fine particles or fumes generated at this time may interfere with the attachment of the driving chip IC to the display panel.

A pad portion PAD may be provided at an end of the sub-region SR of the display panel DP, and a printed circuit board FPCB may be connected to the pad portion PAD. The printed circuit board FPCB may be a flexible printed circuit board or film.

The display panel DP may be formed by cutting a cell-based substrate formed from a parent substrate. The cutting process may be performed by a display device manufacturing apparatus including a laser module. One or more embodiments will be given a more detailed description below.

Figure 3:
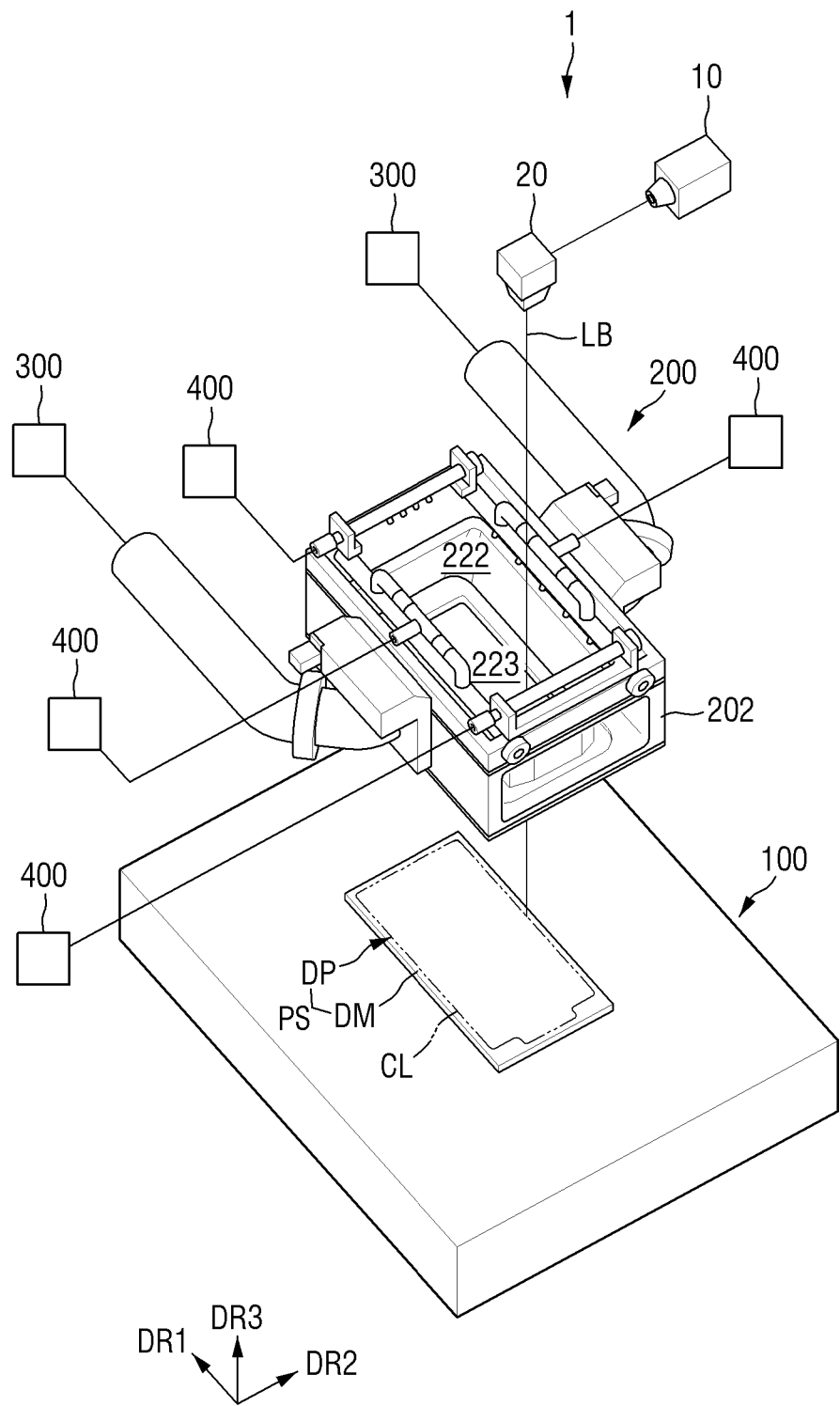
FIG. 3 is a perspective view illustrating an embodiment of a display device manufacturing apparatus constructed according to principles of the invention.

FIG. 3 is a perspective view illustrating an embodiment of a display device manufacturing apparatus constructed according to principles of the invention.

Referring to FIG. 3, a target substrate PS cut by a display device manufacturing apparatus 1 may be a display panel or a substrate of a display device such as an organic light emitting display device. The display device manufacturing apparatus 1 may be used to cut an inspection pad for inspecting an organic light emitting display panel, or to cut a protective film attached to protect an organic light emitting display panel.

As shown by a dotted line in FIG. 3, the target substrate PS before cutting may have a generally rectangular shape. In order to form the display device DD to have four rounded corners and have the L-shaped cut regions of the bending region BD and the main region MR, a laser beam LB may be used to cut along a cutting line CL of a generally closed shape, which may be curved or linear or both. The cutting line CL may be a predetermined virtual cutting line to which the laser beam LB is active on the target substrate PS. However, the embodiments are not limited thereto, and an actual cutting line CL may be formed. The cutting line CL may be an edge of the display panel DP after cutting. The target substrate PS before cutting may include a central portion disposed inside the cutting line CL to become the display panel DP after cutting, and an edge portion disposed outside the cutting line CL to become a dummy portion DM after cutting.

The display device manufacturing apparatus 1 according to some embodiments may be an apparatus capable of cutting the target substrate PS by irradiating the laser beam LB onto the target substrate PS. The display device manufacturing apparatus 1 may include a laser module 10, an optical system 20, a support in the form of a stage unit 100 and a vacuum in the form of a suction unit 200.

A laser in the form of a laser module 10 may emit the laser beam LB. The laser beam LB may be irradiated along the cutting line CL of the target substrate PS. The laser module 10 may include a gas laser such as a carbon dioxide laser, an excimer laser, and a helium-neon laser, or a solid laser such as a ruby laser, a glass laser, a YAG laser, and a YLF laser.

The optical system 20 may adjust the path of the laser beam LB such that the laser beam LB emitted from the laser module 10 reaches the target substrate PS. The optical system 20 may include a homogenizer that homogenizes the shape of the laser beam LB and/or a condensing lens that focuses the laser beam LB. The laser beam LB passing through the optical system 20 may form a line beam. Depending on the relative arrangement of the laser module 10 and the optical system 20, the optical system 20 may further include a mirror for changing the direction of the laser beam LB. For example, the optical system 20 may include a galvano scanner or a polygon mirror.

The stage unit 100 provides a space in which the target substrate PS is mounted and may support the target substrate PS. That is, the target substrate PS may be mounted on the stage unit 100. The stage unit 100 may include an adsorption hole disposed on the top surface thereof and opened upward. The stage unit 100 may fix the target substrate PS by providing a negative pressure through the adsorption hole. The target substrate PS may be generally disposed at the center of the stage unit 100, but the embodiments are not limited thereto.

The suction unit 200 may be located above the stage unit 100. When the laser beam LB is active along the cutting line CL of the target substrate PS, fumes may be generated. The suction unit 200 may suck the fumes and discharge them to the outside. The suction unit 200 will be described below in more detail.

The display device manufacturing apparatus 1 according to some embodiments may further include a dust collecting unit 300 and a control unit. The dust collecting unit 300 may be connected to the suction unit 200 by a connection pipe C. The dust collecting unit 300 may collect fumes sucked by the suction unit 200. The dust collecting unit 300 may include a motor, a pump, a fan, or the like for adjusting the negative pressure provided through the suction unit 200. However, the embodiments are not limited thereto, and a motor, a pump, a fan, or the like may be provided separately from the dust collecting unit 300. The dust collecting unit 300 may include a filter for filtering fumes. The control unit may control the characteristics of the laser beam LB generated by the laser module 10, the negative pressure provided by the dust collecting unit 300, and the like.

Figure 4:
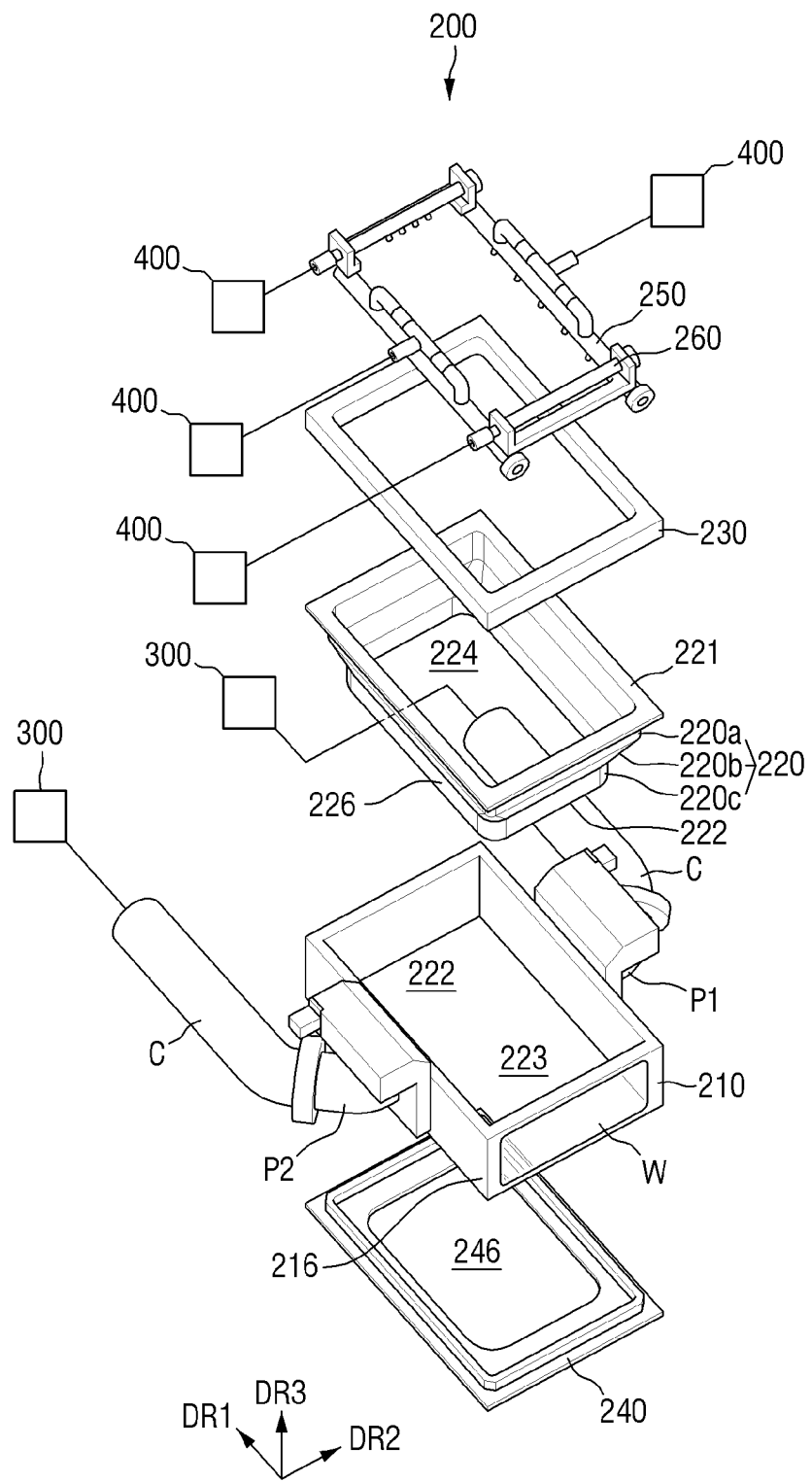
FIG. 4 is an exploded perspective view illustrating an embodiment of a suction unit of the manufacturing apparatus constructed according to principles of the invention.
Figure 5:
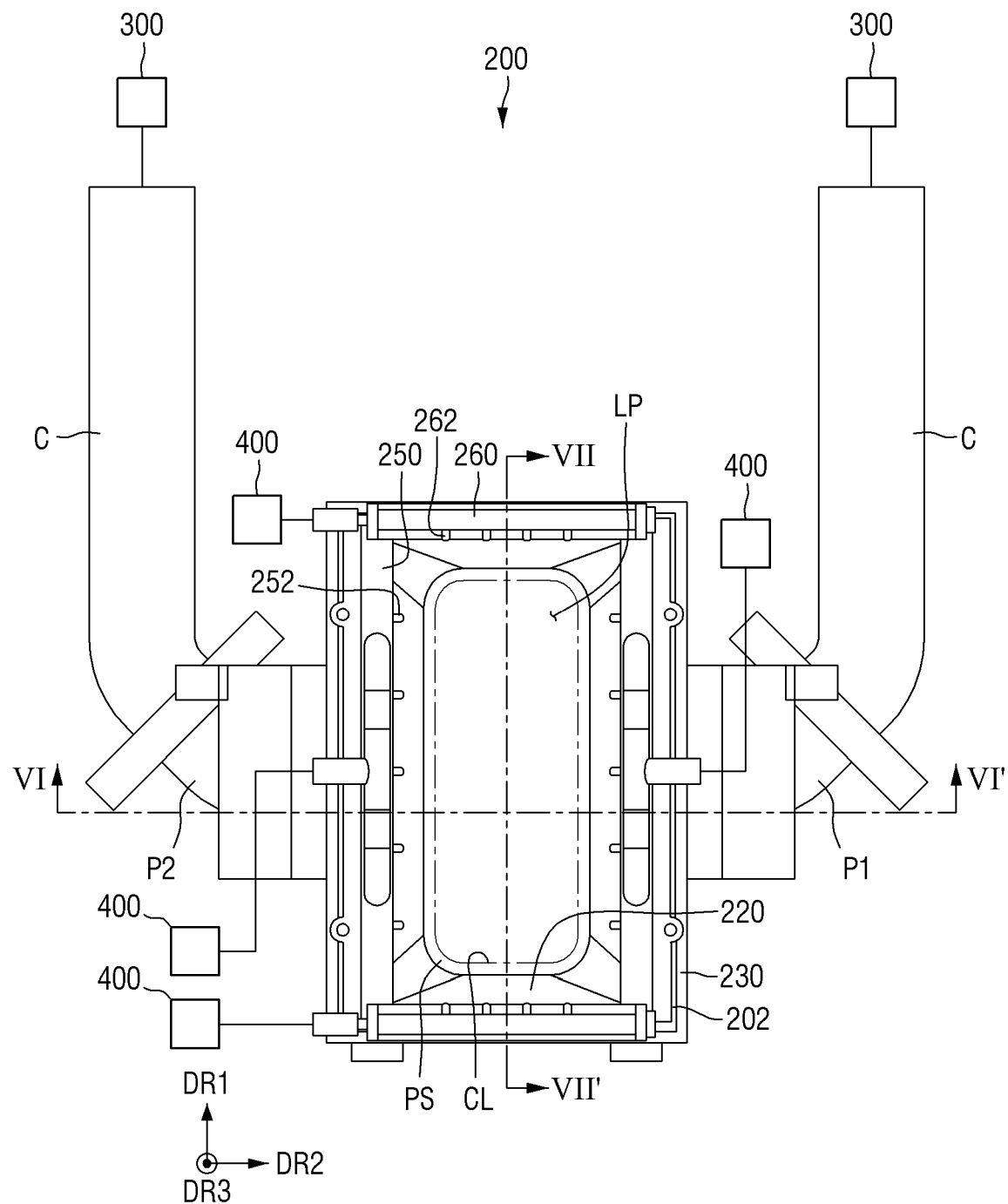
FIG. 5 is a plan view of the display device manufacturing apparatus embodiment of FIG. 3.
Figure 6:
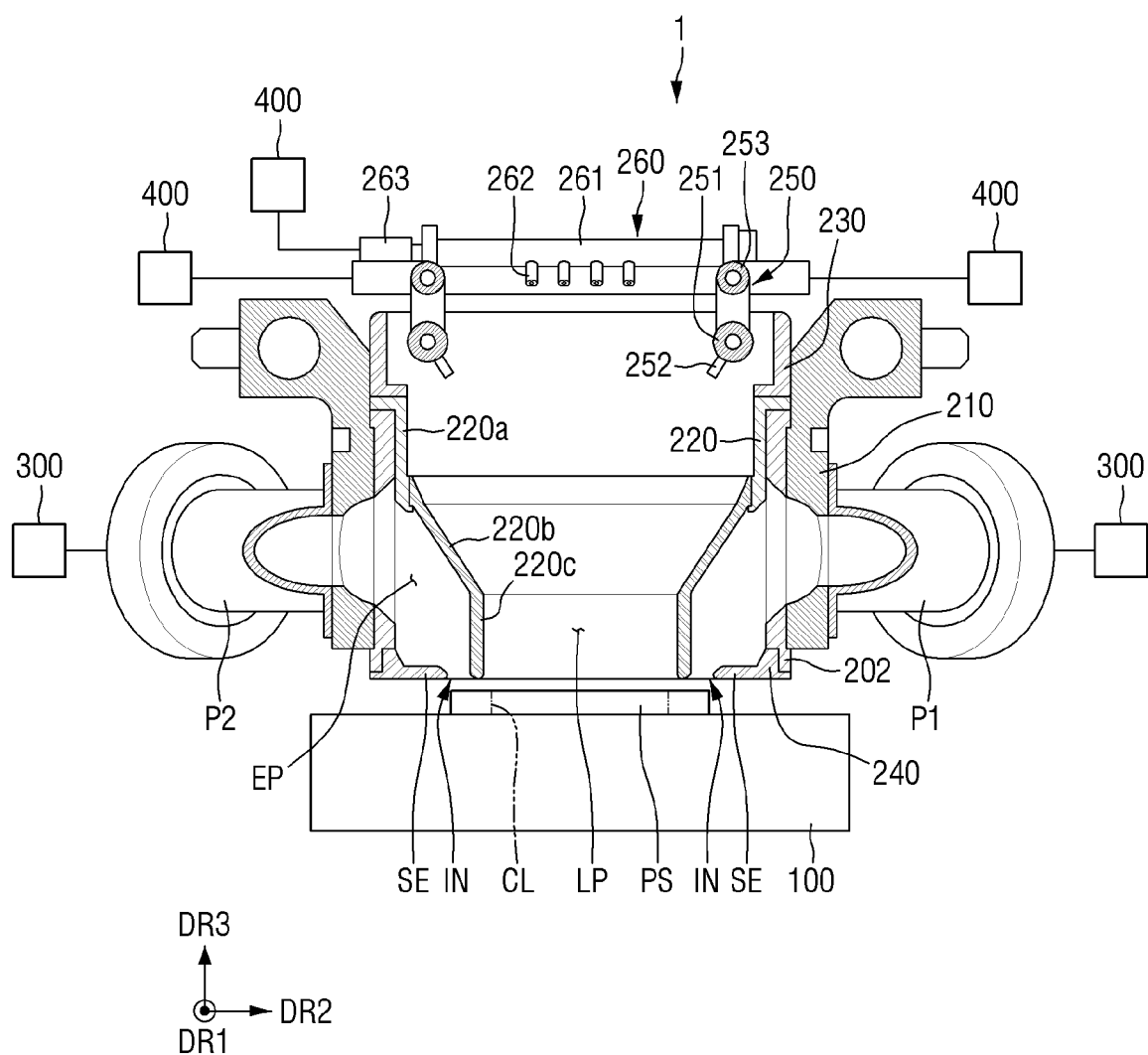
FIG. 6 is a cross-sectional view taken along line VI-VI' of FIG. 5.
Figure 7:
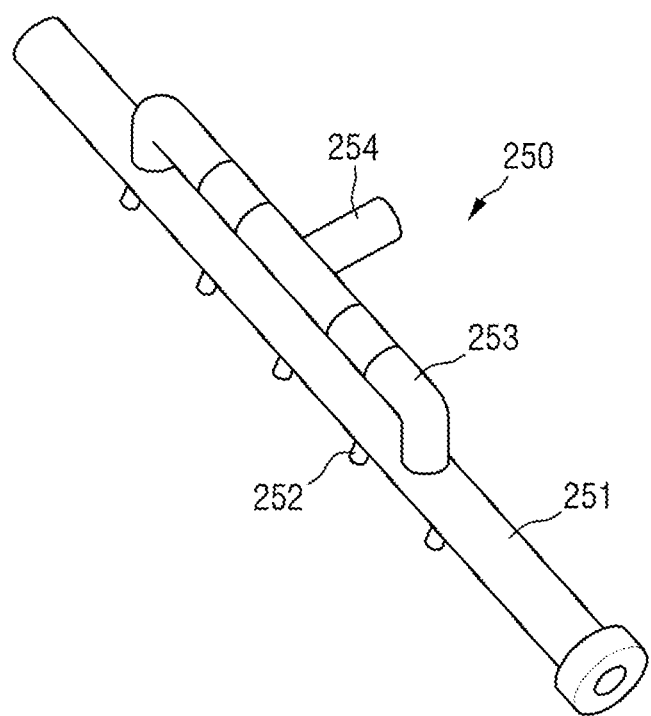
FIG. 7 is a perspective view illustrating an embodiment of a first air blower constructed according to principles of the invention.
Figure 8:
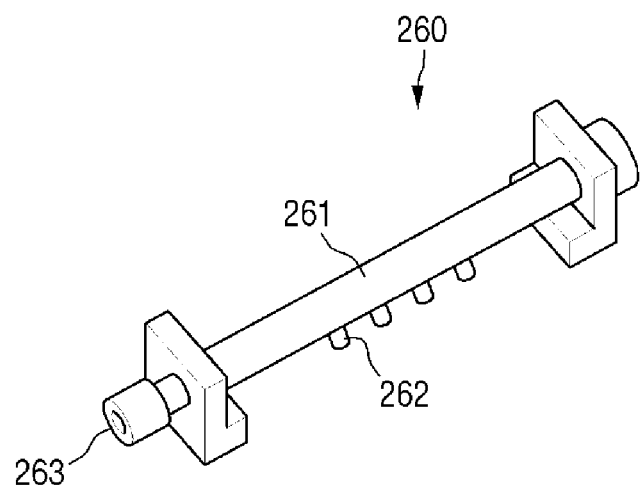
FIG. 8 is a perspective view illustrating an embodiment of a second air blower constructed according to principles of the invention.

FIG. 4 is an exploded perspective view illustrating an embodiment of a suction unit of the manufacturing apparatus constructed according to principles of the invention. FIG. 5 is a plan view of the display device manufacturing apparatus of an embodiment of FIG. 3. FIG. 6 is a cross-sectional view taken along line VI-VI' of FIG. 5. FIG. 7 is a perspective view illustrating an embodiment of a first air blower constructed according to principles of the invention. FIG. 8 is a perspective view illustrating an embodiment of a second air blower constructed according to principles of the invention.

Referring to FIGS. 3 to 8, the suction unit 200 may include a housing in the form of a main body 202, pipes P1 and P2, a connection pipe C, and first and second blowers in the form of fluid, typically air, blowers 250 and 260. The pipes P1 and P2 may be disposed on both sides of the main body 202, the connection pipe C may connect the pipes P1 and P2 to the dust collecting unit 300, and the air blowers 250 and 260 may be disposed above the main body 202.

The main body 202 may include an enclosure in the form of an outer box 210 with top and bottom openings 222 and 223 and an insert in the form of an inner cup 220 having at least a part 226, such as a lower end, disposed in the outer box 210. The inner cup 220 may include top and bottom openings 222 and 223 respectively corresponding to the top and bottom openings 222 and 223 of the outer box 210. The main body 202 may trap fumes generated during the cutting process inside to prevent them from escaping to the outside. The main body 202 may have an empty internal chamber opened at the top and bottom sides so that the laser beam LB emitted through the optical system 20 is irradiated to the target substrate PS. In addition, the main body 202 may have a structure capable of effectively sucking fumes generated during the cutting process. Hereinafter, a detailed structure of the outer box 210 and the inner cup 220 will be described.

The outer box 210 may have a substantially rectangular pillar shape, but the embodiments are not limited thereto, and may have a shape of a substantially cylindrical or a substantially polygonal pillar other than the substantially rectangular pillar. In some embodiments, the outer box 210 may have a substantially rectangular pillar shape including a long side extending in a first direction DR1 and a short side extending in a second direction DR2.

The outer box 210 defines an empty chamber inside and may accommodate the inner cup 220. The outer box 210 may include a transparent window W disposed on at least one surface thereof. The inside chamber of the outer box 210 may be observed through the transparent window W. The pipes P1 and P2 communicating with the inside of the outer box 210 may be coupled to or formed on at least one side of the outer box 210.

The inner cup 220 may be disposed in the outer box 210. The inner cup 220 may include an upper sidewall 220a of a hollow substantially rectangular pillar shape, an inclined sidewall 220b of a hollow truncated generally quadrangular pyramid shape, and a lower sidewall 220c of a hollow substantially rectangular pillar shape. The inner cup 220 may be separated from the outer box 210. The inner cup 220 may have a three-dimensional structure similar to a generally rectangular funnel or hopper. The inner cup 220 may have a shape corresponding to the shape of the outer box 210. For example, if the outer box 210 has a generally cylindrical shape, the inner cup 220 may have a three-dimensional structure similar to a generally circular funnel.

An inner space LP of the inner cup 220 may provide a passage through which the laser beam LB passes. The laser beam LB may pass through the main body 202 and be irradiated along the cutting line CL of the target substrate PS. Therefore, the cutting line CL of the target substrate PS may be disposed inside the bottom opening of the main body 202 in plan view.

The upper sidewall 220a, the inclined sidewall 220b, and the lower sidewall 220c of the inner cup 220 may be formed as a single component or integrally, and at least a portion thereof may be formed separately and assembled. However, the embodiments are not limited thereto. The inclined sidewall 220b and the lower sidewall 220c of the inner cup 220 may be integrally formed, the upper sidewall 220a thereof may be separately formed, and the upper portion of the inclined sidewall 220b may be coupled to the lower portion of the upper sidewall 220a.

The inner cup 220 may include a flange 221 disposed on the top thereof. The flange 221 may allow the inner cup 220 to be supported at the top of the outer box 210 so that the inner cup 220 does not fall downward. The flange 221 may be located between the top of the outer box 210 and the bottom of a bracket 230. When the bracket 230 is coupled to the outer box 210 by a coupling means such as a screw, the flange 221 is positioned between them, so that the inner cup 220 may be fixed to the outer box 210.

The top opening of the main body 202 may be defined by the upper end of the upper sidewall 220a of the inner cup 220, and the bottom opening of the main body 202 may be defined by the lower end of the lower sidewall 220c of the inner cup 220. The top opening of the main body 202 may be larger than the bottom opening thereof. Therefore, the inclined sidewall 220b may have a structure in which the internal width thereof decreases as going from the upper sidewall 220a to the lower sidewall 220c. That is, the inside of the inclined sidewall 220b may have a structure in which the internal width gradually decreases like a funnel. Therefore, a downflow effect is maintained inside the inner cup 220, so that the suction of fumes may be performed smoothly. The outer surface of the upper sidewall 220a may be in close contact with the inner surface of the outer box 210.

The suction unit 200 may further include a bracket 230 for fixing the inner cup 220 and a base in the form of lower plate 240 that defines an inlet in the form of a suction inlet IN forming a downward opening in cooperation with the inner cup 220 and defines an exhaust passageway EP in cooperation with the outer box 210 and the inner cup 220.

The lower plate 240 may be coupled to an at least a part 216 in the form of a first or lower end of the outer box 210. The lower plate 240 may be coupled to the lower end of the outer box 210 by a slide insertion method, a coupling means such as a mechanical fastener, such as a screw, or the like. The lower plate 240 may include a through hole 246 penetrating the inside thereof. The through hole 246 of the lower plate 240 may be larger than the bottom opening 224 of the inner cup 220.

The lower plate 240 may include a suction end SE which is an end portion defining the through hole 246 and surrounds the through hole 246. The suction end SE may overlap the lower end portion of the lower sidewall 220c of the inner cup 220. The suction end SE and the lower end portion of the lower sidewall 220c of the inner cup 220 may define the suction inlet IN. The fumes from the outside may be sucked into the suction unit 200 through the suction inlet IN. The suction inlet IN may be disposed around the lower end portion of the lower sidewall 220c of the inner cup 220. The suction inlet IN may be opened in the vertical direction, but the embodiments are not limited thereto.

The top surface of the lower plate 240, the inner surface of the outer box 210 and the outer surface (particularly, the outer surfaces of the inclined sidewall 220b and the lower sidewall 220c) of the inner cup 220 may define the exhaust passageway EP. The exhaust passageway EP may be a space through which the fumes sucked through the suction inlet IN flow inside the main body 202. The exhaust passageway EP may be substantially sealed except for the suction inlet IN and portions communicating with the pipes P1 and P2. Therefore, most of the fumes sucked through the suction inlet IN may move to the pipes P1 and P2 through the exhaust passageway EP. The fumes that have moved to the pipes P1 and P2 may be collected in the dust collecting unit 300 through the connection pipe C.

The air blowers 250 and 260 may be disposed above the main body 202. The air blowers 250 and 260 may inject air toward the target substrate PS. The air provided by the air blowers 250 and 260 may form a fluid flow, such as an air flow, in the inner space LP of the inner cup 220. The air blowers 250 and 260 may include a pair of first air blowers 250 disposed along the long sides of the outer box 210 and a pair of second air blowers 260 disposed along the short sides thereof.

The first air blowers 250 may be disposed opposite each other along the long sides of the outer box 210. The first air blower 250 may include a first conduit in the form of a first main pipe 251, a plurality of first nozzles 252 arranged along the first direction DR1 at the bottom of the first main pipe 251, and a first auxiliary pipe 253 disposed at the top of the first main pipe 251.

The first main pipe 251 may extend along the first direction DR1 and include an internal flow path. The first main pipe 251 may be disposed along the long side of the outer box 210. The first main pipe 251 provides a space for accommodating air before the air is injected through the first nozzle 252. The space for accommodating air may be the internal flow path of the first main pipe 251. The air accommodated in the internal flow path of the first main pipe 251 may be supplied from the first auxiliary pipe 253 disposed at the top thereof and injected into the inner space LP of the inner cup 220 through the first nozzle 252 disposed at the bottom thereof. The injection direction of the air may be substantially the same as the direction indicated by the first nozzle 252. The air injected through the first nozzle 252 may form an air flow in the injection direction.

The first nozzle 252 may be a passage through which air accommodated inside the first main pipe 251 is injected to the outside. The plurality of first nozzles 252 may be arranged along the extending direction of the first main pipe 251 at the bottom of the first main pipe 251. The first nozzle 252 may extend in a direction substantially perpendicular to the first main pipe 251. The inclination of the first nozzle 252 may be changed. The inclination of the first nozzle 252 may be defined as an angle at which the first nozzle 252 is inclined with respect to a plane substantially parallel to one surface of the target substrate PS. The injection angle of the air injected from the first nozzle 252 may be substantially the same as the inclination of the first nozzle 252. The first nozzle 252 may be configured to have an adjustable inclination, but the embodiments are not limited thereto, and may have a fixed inclination.

In some embodiments, the inclination of the first nozzle 252 may be set such that the air injected from the first nozzle 252 crosses the inner space LP of the inner cup 220. The first nozzle 252 may be directed toward the suction inlet IN that is disposed below the first air blower 250 including the corresponding first nozzle 252 to face the first air blower 250. Accordingly, an air flow formed by the air injected from the first nozzle 252 may be sucked into the suction inlet IN disposed on the opposite side of the first nozzle 252. In addition, air flows formed by air injected from the first nozzles 252 disposed opposite each other may intersect each other in the inner space LP of the inner cup 220, but the embodiments are not limited thereto.

FIGS. 4 to 7 illustrate the first air blower 250 including five first nozzles 252, but the number of the first nozzles 252 is not limited thereto and may be variously set depending on the size of the target substrate PS. Specifically, the number of the first nozzles 252 may be set such that air injected from the first nozzles 252 covers the entire long side region of the target substrate PS.

The first auxiliary pipe 253 may receive air from an external air supply device 400 and supply the air to the first main pipe 251. The first auxiliary pipe 253 may extend in the same direction as the first main pipe 251. The first auxiliary pipe 253 may have a shorter length than the first main pipe 251. The first auxiliary pipe 253 may include an internal flow path, similarly to the first main pipe 251. One side and the other side of the internal flow path of the first auxiliary pipe 253 may be spatially connected to the internal flow path of the first main pipe 251. The first air blower 250 may further include a first connection portion 254 which connects the internal flow path of the first auxiliary pipe 253 to the air supply device 400. The first connection portion 254 may be connected to the air supply device 400 through a connection member such as a hose. Each of the first air blowers 250 may receive air from a different air supply device 400, but the embodiments are not limited thereto, and may receive air from the same air supply device 400. The first connection portion 254 may be disposed at the center of the first auxiliary pipe 253 and have a shape protruding outward, but the embodiments are not limited thereto.

The air supplied from the air supply device 400 may enter the inside of the first auxiliary pipe 253 through the first connection portion 254 and proceed to one side and the other side of the internal flow path of the first auxiliary pipe 253 to enter the inside of the first main pipe 251. The air that has entered the inside of the first main pipe 251 may be injected to the outside through the first nozzle 252. The air injection direction may be determined by the inclination of the first nozzle 252 as described above.

The second air blowers 260 may be disposed on one end portion and the other end portion of each first air blower 250 opposing each other in the first direction DR1. Specifically, one second air blower 260 may be disposed to overlap one end portions or the other end portions of the first air blowers 250 opposing each other in the second direction DR2. The second air blowers 260 may be disposed opposite each other in the first direction DR1. That is, the second air blower 260 may be disposed to cross the first air blower 250.

The second air blower 260 may include a second conduit in the form of a second main pipe 261, a plurality of second nozzles 262 arranged along the second direction DR2 at the bottom of the second main pipe 261, and a second connection portion 263 disposed at one side of the extending direction of the second main pipe 261.

The second main pipe 261 may extend along the second direction DR2 and include an internal flow path. The second main pipe 261 may be disposed along the short side of the outer box 210. The second main pipe 261 provides a space for accommodating air before the air is injected through the second nozzle 262. The space for accommodating air may be the internal flow path of the second main pipe 261. The air accommodated in the internal flow path of the second main pipe 261 may be supplied from the second connection portion 263 disposed at one side of the extending direction of the second main pipe 261 and injected to the outside through the second nozzle 262 disposed at the bottom of the second main pipe 261. The injection direction of the air may be substantially the same as the direction indicated by the second nozzle 262.

The second nozzle 262 may be a passage through which air accommodated inside the second main pipe 261 is injected to the outside. The plurality of second nozzles 262 may be arranged along the extending direction of the second main pipe 261 at the bottom of the second main pipe 251. The second nozzle 262 may have a shape extending in one direction. The inclination of the second nozzle 262 may be defined as an angle at which the second nozzle 262 is inclined with respect to a plane substantially parallel to one surface of the target substrate PS.

The injection angle of the air injected from the second nozzle 262 may be substantially the same as the inclination of the second nozzle 262. The second nozzle 262 may be configured to have an adjustable inclination, but the embodiments are not limited thereto, and may have a fixed inclination.

In some embodiments, the inclination of the second nozzle 262 may be set such that air injected from the second nozzle 262 intersects the inner space LP of the inner cup 220. The second nozzle 262 may be directed toward the suction inlet IN that is disposed below the second air blower 260 including the corresponding second nozzle 262 to face the second air blower 260. Accordingly, an air flow formed by the air injected from the second nozzle 262 may be sucked into the suction inlet IN disposed on the opposite side of the second nozzle 262. In addition, air flows formed by air injected from the second nozzles 262 disposed opposite each other may cross each other in the inner space LP of the inner cup 220, but the embodiments are not limited thereto.

FIGS. 4 to 6 and 8 illustrate the second air blower 260 including four second nozzles 262, but the number of the second nozzles 262 is not limited thereto and may be variously set depending on the size of the target substrate PS. Specifically, the number of the second nozzles 262 may be set such that air injected from the second nozzles 262 covers the entire short side region of the target substrate PS.

The external air supply device 400 may be connected to the second connection portion 263. The second connection portion 263 may be a connection passage that connects the air supply device 400 to the second main pipe 261. The air provided from the air supply device 400 may be supplied to the second main pipe 261 through the second connection portion 263. The second connection portion 263 may be connected to the air supply device 400 through a connection member such as a hose.

The air supplied from the air supply device 400 may enter the inside of the second main pipe 261 through the second connection portion 263. The air that has entered the inside of the second main pipe 261 may be injected to the outside through the second nozzle 262. The air injection direction may be determined by the inclination of the second nozzle 262 as described above.

An air flow may be formed, by the air injected from the first nozzle 252 and the second nozzle 262, in the inner space LP of the inner cup 220 along the air injection direction.

The air flow formed in the inner space LP of the inner cup 220 may help the fumes to be sucked into the suction inlet IN. Specifically, the fumes may be sucked into the suction inlet IN along with the air flow and moved to the exhaust passageway EP. A more detailed description of the fume suction process will be given later with reference to FIGS. 9 to 12.

In the display device manufacturing apparatus according to some embodiments, an air flow toward the suction inlet IN is formed by the air blowers 250 and 260 through which air is injected, so that fumes generated at the target substrate PS may be effectively sucked into the suction inlet IN. Further, fumes moving along the air flow may be effectively sucked through the structure of the suction inlet IN opened downward.

Figure 9:
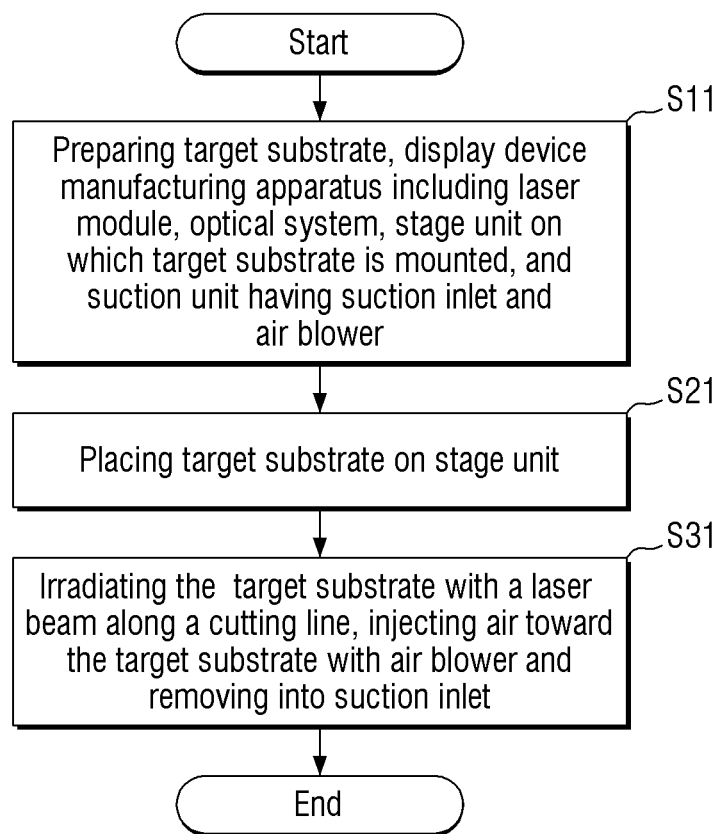
FIG. 9 is a flowchart illustrating an embodiment of a display device manufacturing method according to principles of the invention.
Figure 10:
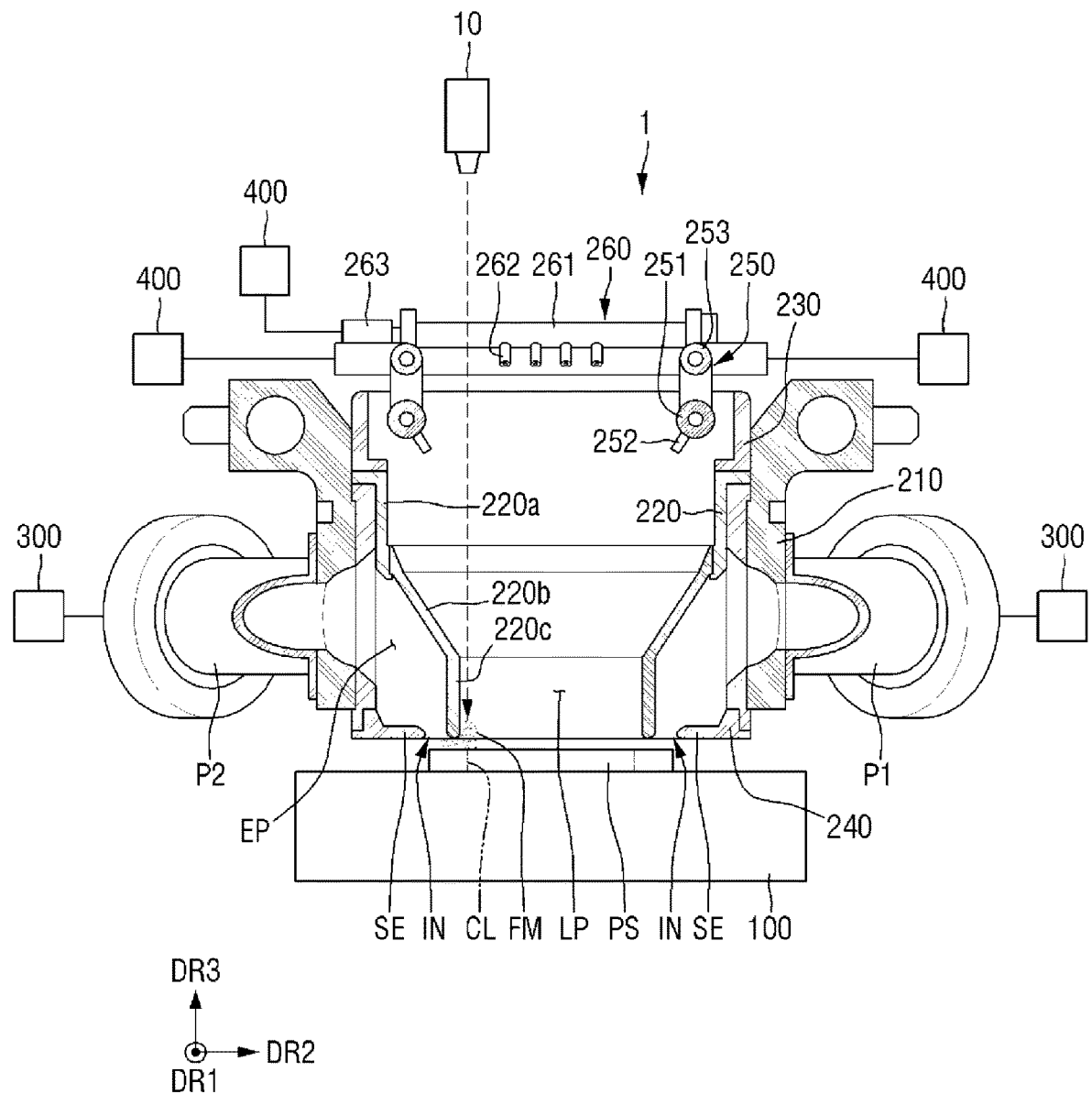
FIGS. 10 to 12 are schematic diagrams illustrating an embodiment of a display device manufacturing method according to principles of the invention.
Figure 11:
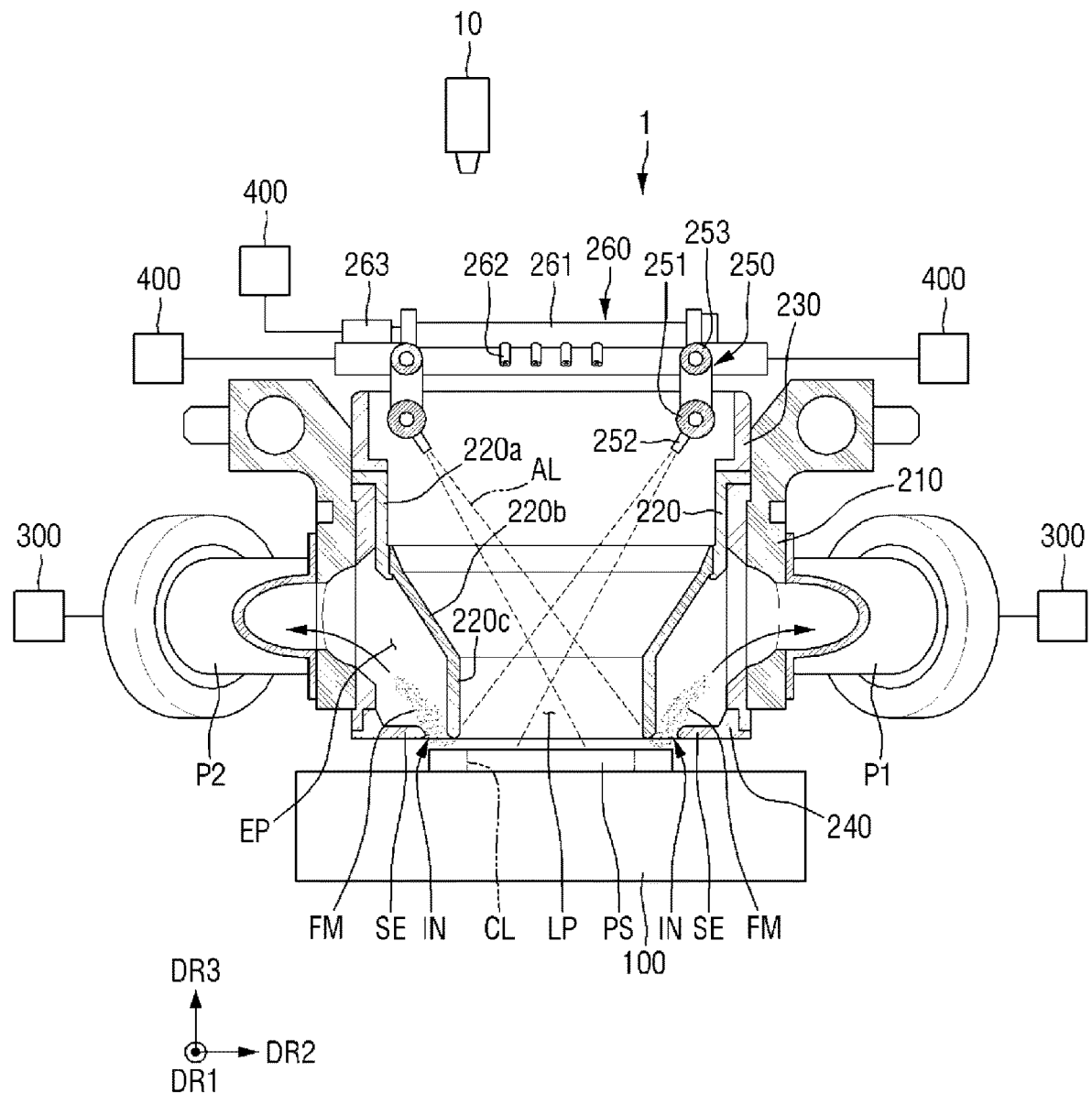
Figure 12:
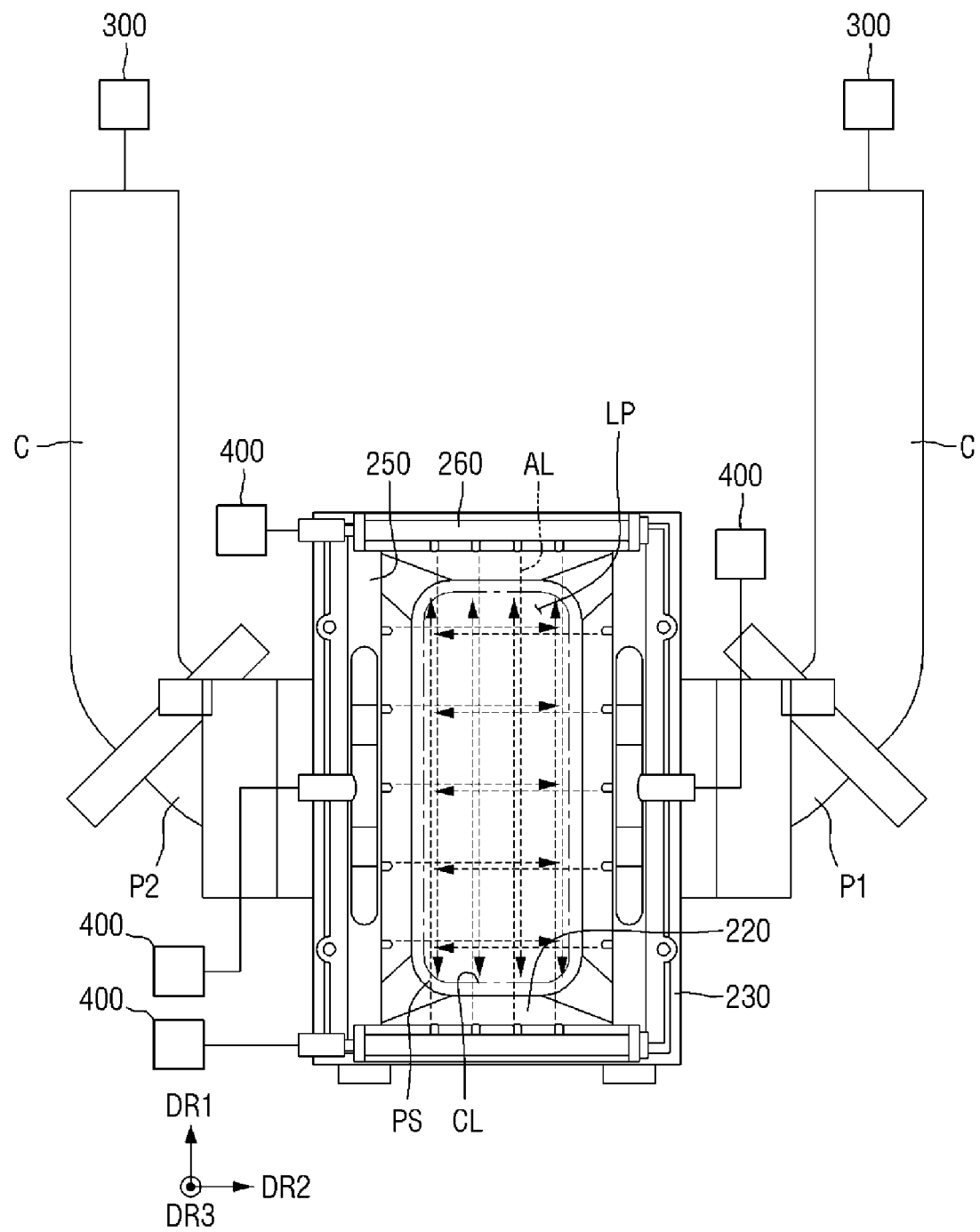

FIG. 9 is a flowchart illustrating an embodiment of a display device manufacturing method according to principles of the invention. FIGS. 10 to 12 are schematic diagrams illustrating an embodiment of a display device manufacturing method according to principles of the invention.

Referring to FIGS. 9 to 12, a display device manufacturing method according to some embodiments may include step S11 of preparing a target substrate and a display device manufacturing apparatus including a laser module, an optical system, a stage unit on which the target substrate is mounted, and a suction unit having a suction inlet and an air blower; step S21 of placing the target substrate on the stage unit; and step S31 of irradiating the target substrate with a laser beam along a cutting line, injecting air toward the target substrate with the air blower, and removing, such as sucking, into the suction inlet.

Regarding the step S11 of preparing a target substrate and a display device manufacturing apparatus including a laser module, an optical system, a stage unit on which the target substrate is mounted, and a suction unit having a suction inlet and an air blower, details of the target substrate PS and the display device manufacturing apparatus 1 have been described above with reference to FIGS. 3 to 8 and thus will be omitted to avoid redundancy.

After the step S11 of preparing the target substrate PS and the display device manufacturing apparatus 1, the step S21 of placing the target substrate PS on the stage unit 100 may be performed. As described above, the target substrate PS may be mounted on the stage unit 100.

When the target substrate PS has been mounted on the stage unit 100 (step S21), the step S31 of irradiating a laser beam along a cutting line of the target substrate, injecting air toward the target substrate with the air blower, and sucking into the suction inlet may be performed. The process of irradiating a laser beam LB along a cutting line CL of the target substrate PS, the process of injecting air toward the target substrate PS with the air blower 250, 260 of the suction unit 200 and the process of sucking into the suction inlet may be performed simultaneously, but the embodiments are not limited thereto.

As described above, the cutting line CL may be a predetermined virtual cutting line to which the laser beam LB is active on the target substrate PS. However, the embodiments are not limited thereto, and an actual cutting line CL may be formed. The cutting line CL may have a generally closed shape such as curved, linear or both. The laser beam LB may be irradiated along the cutting line CL. The laser beam LB may be irradiated along the cutting line CL of the closed curve for at least one cycle to cut the target substrate PS. The target substrate PS may be cut to form the display panel DP shown in FIGS. 1 and 2.

When cutting the target substrate PS using the laser beam LB, fumes FM may be generated in an area to which the laser beam LB is active. The fumes FM are fine particles generated when the target substrate PS is cut, and may be diffused to the surrounding area. The fumes FM may interfere with the irradiation of the laser beam LB onto the cutting line CL by blocking the laser beam LB. When the laser beam LB is blocked by the fumes FM, the irradiation amount of the laser beam LB irradiated onto the cutting line CL per unit area may be reduced, resulting in incomplete processing of the target substrate PS. Therefore, in order to process the target substrate PS under a desired condition, it is necessary to effectively remove the fumes FM generated when the laser beam LB is active.

The suction unit 200 may be introduced to remove the fumes FM. As described above, the suction unit 200 may suck the fumes FM and discharge them to the outside, through the negative pressure provided by the dust collecting unit 300. Specifically, the fumes FM may be sucked through the suction inlet IN of the suction unit 200. The suction inlet IN may be disposed at the lower portion of the suction unit 200 and may have a shape defined by a downwardly directed opening. The suction inlet IN may be disposed outside the cutting line CL. The suction inlet IN may not overlap the cutting line CL of the target substrate PS, but the embodiments are not limited thereto.

The suction unit 200 may have a strong vacuum force in a region below the suction inlet IN. Thus, in order to effectively remove the fumes FM, it may be preferable to move the fumes FM to the region below the suction inlet IN. The suction inlet IN may be disposed outside the cutting line CL. As described above, since the fumes FM may be generated along the cutting line CL, if the fumes FM are moved outside the cutting line CL, the fumes FM may be effectively removed. An air flow for moving the fumes FM to the outside of the cutting line CL may be formed by injecting air through the air blowers 250 and 260. In this case, when the fumes FM are moved outside the cutting line CL, they are mostly sucked through the suction inlet IN of the suction unit 200, so the fumes FM may hardly leak to the outside of the suction unit 200.

As described above, the air blowers 250 and 260 may include first air blowers 250 disposed along the long sides of the outer box 210 and second air blowers 260 disposed along the short sides thereof.

The air injected from the first air blower 250 may move the fumes FM generated in a long side region of the cutting line CL of the target substrate PS to the region below the suction inlet IN disposed outside the corresponding long side region. The first air blower 250 includes at least one first nozzle 252, and an air flow formed by the air injected from the first nozzle 252 may move the fumes FM generated in the long side region of the cutting line CL of the target substrate PS to the outside of the cutting line CL.

In some embodiments, the air injected from the first air blower 250 disposed on one side in the second direction DR2 may be directed to a lower end portion of the inner cup 220 of the other side in the second direction DR2. Therefore, the fumes FM generated around the cutting line CL adjacent to the lower end portion of the inner cup 220 of the other side in the second direction DR2 may be moved to the outside of the cutting line CL, specifically, to the other side in the second direction DR2. The air injected from the first air blower 250 disposed at the other side in the second direction DR2 may be directed to a lower end portion of the inner cup 220 of the one side in the second direction DR2. Therefore, the fumes FM generated around the cutting line CL adjacent to the lower end portion of the inner cup 220 of the one side in the second direction DR2 may be moved to the outside of the cutting line CL, specifically, to the one side in the second direction DR2.

The fumes FM that has moved to the outside of the cutting line CL may be sucked into the suction inlet IN by the negative pressure provided from the suction inlet IN and discharged to the outside. That is, the air injected from the first air blower 250 may help the fumes FM to be effectively sucked into the suction unit 200.

As described above, the first air blowers 250 may be disposed opposite each other. The air streams injected from the first air blowers 250 opposing each other may intersect each other in the inner space LP of the inner cup 220. The air injected from the first nozzle 252 of the first air blower 250 may not be affected by the air injected from the other first nozzle 252 and/or the second nozzle 262, due to its strong straightness. However, the embodiments are not limited thereto, and the intersected air may form an air flow directed downwardly.

Similarly, the air injected from the second air blower 260 may move the fumes FM generated in a short side region of the cutting line CL of the target substrate PS to the region below the suction inlet IN disposed outside the corresponding short side region. The second air blower 260 includes at least one second nozzle 262, and an air flow formed by the air injected from the second nozzle 262 may move the fumes FM generated in the short side region of the cutting line CL of the target substrate PS to the outside of the cutting line CL.

In some embodiments, the air injected from the second air blower 260 disposed on one side in the first direction DR1 may be directed to a lower end portion of the inner cup 220 on the other side in the first direction DR1. Therefore, the fumes FM generated around the cutting line CL adjacent to the lower end portion of the inner cup 220 on the other side in the first direction DR1 may be moved to the outside of the cutting line CL, specifically, to the other side in the first direction DR1. The air injected from the second air blower 260 disposed on the other side in the first direction DR1 may be directed to a lower end portion of the inner cup 220 on the one side in the first direction DR1. Therefore, the fumes FM generated around the cutting line CL adjacent to the lower end portion of the inner cup 220 on the one side in the first direction DR1 may be moved to the outside of the cutting line CL, specifically, to the one side in the first direction DR1.

The fumes FM that have moved to the outside of the cutting line CL may be sucked into the suction inlet IN by the negative pressure provided from the suction inlet IN and discharged to the outside. That is, the air injected from the second air blower 260 may help the fumes FM to be effectively sucked into the suction unit 200.

As described above, the second air blowers 260 may be disposed opposite each other. The air streams injected from the second air blowers 260 opposing each other may intersect each other in the inner space LP of the inner cup 220. The air injected from the second nozzle 262 of the second air blower 260 may not be affected by the air AL injected from the other second nozzle 262 and/or the first nozzle 252, due to the strength of its jet stream. However, the embodiments are not limited thereto, and the intersected air may form an air flow directed downward.

Due to the air AL injected from the air blowers 250 and 260, the fumes FM generated at the target substrate PS may be removed by the suction unit 200 as soon as they are generated, but some of the fumes FM may rise to the inner space LP of the inner cup 220. The fumes FM that have risen to the inner space LP of the inner cup 220 may be moved back to the target substrate PS by a downdraft formed by the air AL injected from the air blowers 250 and 260. The fumes FM that have moved toward the target substrate PS may move back to the outside of the cutting line CL and be sucked into the suction inlet IN. In addition, the first air blower 250 and the second air blower 260 may simultaneously inject air to allow the fumes FM generated from the target substrate PS to be smoothly removed or sucked into the suction inlet IN of the suction unit 200.

In the display device manufacturing method according to some embodiments, fumes FM may be generated along the cutting line CL during a cutting process of the target substrate PS which uses the laser beam LB. At this time, the generated fumes FM may interfere with the processing of the target substrate PS by blocking the laser beam LB, and thus they need to be removed. The fumes FM generated at the target substrate PS may be guided to the vicinity of the suction inlet IN of the suction unit 200 by the air AL injected from the air blowers 250 and 260. Therefore, the fumes FM guided to the vicinity of the suction inlet IN may be effectively removed by the negative pressure provided by the suction unit 200.

Hereinafter, another embodiment of the display device manufacturing apparatus 1 will be described. In the following embodiment, a description of the same components as those of the above-described embodiment will be omitted or simplified to avoid redundancy, and differences will be mainly described. Other matters are the same as or similar to those described above with reference to FIGS. 3 to 8, and thus a detailed description thereof will be omitted to avoid redundancy and reference of those depicted elements may be included below.

Figure 13:
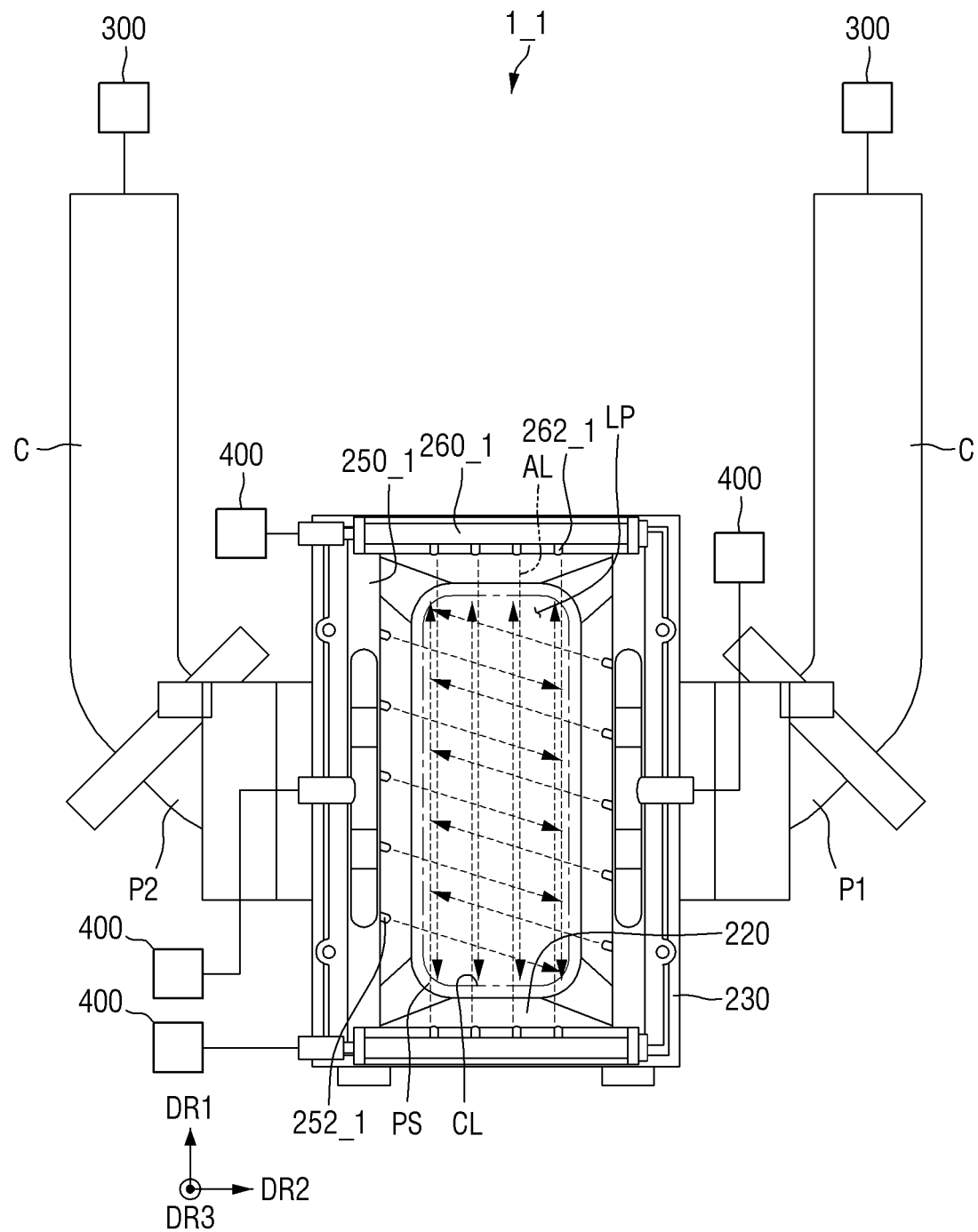
FIG. 13 is a plan view illustrating another embodiment of a display device manufacturing apparatus constructed according to principles of the invention.

FIG. 13 is a plan view illustrating another embodiment of a display device manufacturing apparatus constructed according to principles of the invention.

A display device manufacturing apparatus 1_1 according to some embodiments may include air blowers 250_1 and 260_1 having a different nozzle arrangement from the display device manufacturing apparatus 1 according to the above-described embodiment. Specifically, first nozzles 252_1 included in the display device manufacturing apparatus 1_1 according to some embodiments may be arranged on the first main pipe in a line along the first direction DR1. In the first air blowers 250_1 opposing each other, the first nozzles 252_1 of the first air blower 250_1 provided on one side in the second direction DR2 may be disposed so as not to overlap in the second direction DR2 with the first nozzles 252_1 of the first air blower 250_1 provided at the other side in the second direction DR2. Therefore, the air streams injected from the first nozzles 252_1 opposing each other may not intersect each other, and the air streams injected from the second nozzles 262_1 opposing each other may not intersect each other.

Similarly, the second nozzles 262_1 included in the display device manufacturing apparatus 1_1 according to some embodiments may be arranged on the second main pipe in a line along the second direction DR2. In the second air blowers 260_1 opposing each other, the second nozzles 262_1 of the second air blower 260_1 provided on one side in the first direction DR1 may be disposed so as not to overlap in the first direction DR1 with the second nozzles 262_1 of the second air blower 260_1 disposed on the other side in the first direction DR1.

According to the display device manufacturing apparatus according to some embodiments, an air flow is formed toward the suction inlet IN from the air blowers 250_1 and 260_1 through which air is injected, so that fumes FM generated at the target substrate PS may be effectively sucked into the suction inlet IN. Further, the fumes FM moving along the air flow may be effectively sucked through the structure of the suction inlet IN opened downward.

Hereinafter, another embodiment of the display device manufacturing method will be described. In the following embodiment, a description of the same components as those of the above-described embodiment will be omitted or simplified, and differences will be mainly described.

Figure 14:
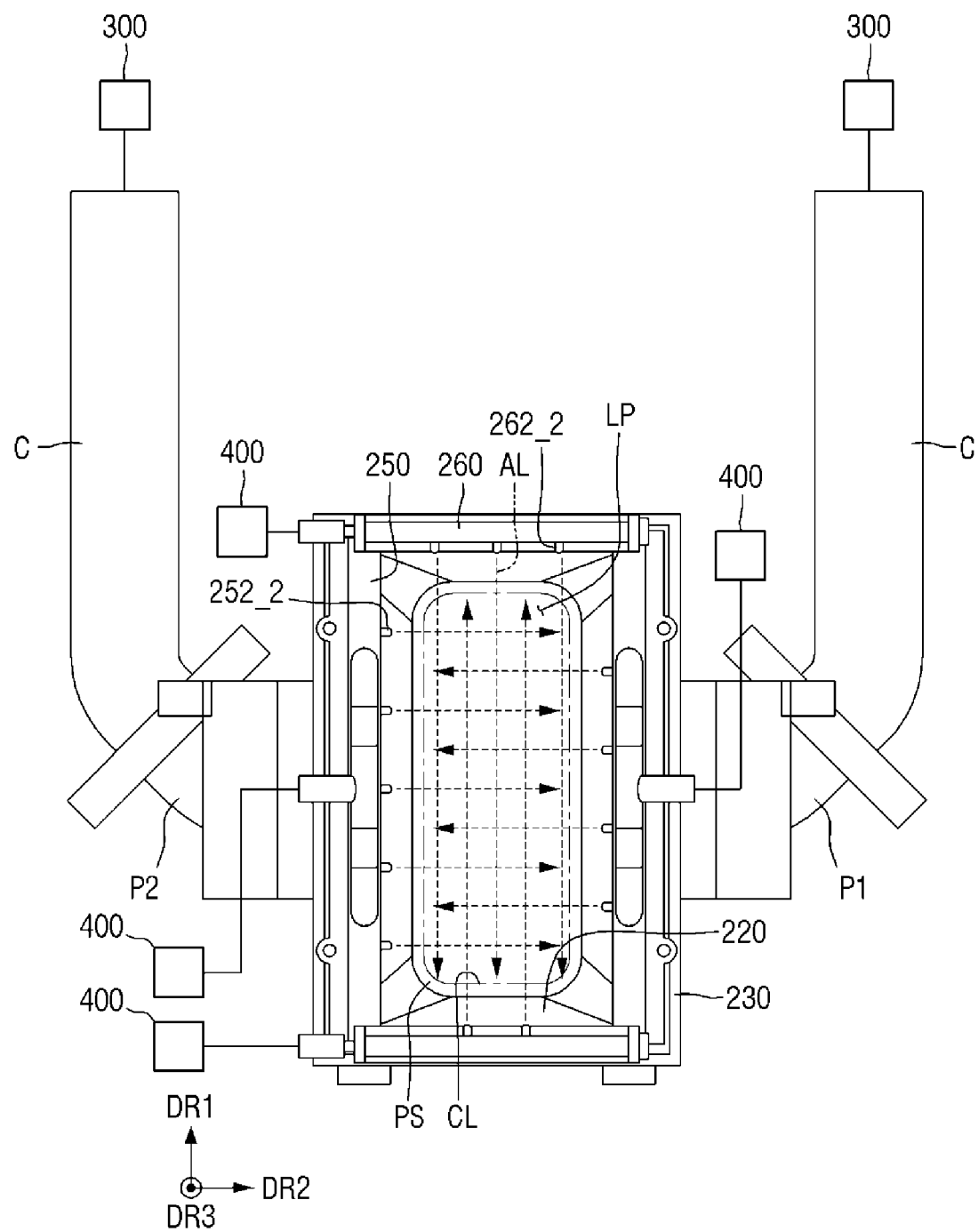
FIG. 14 is a schematic diagram illustrating another embodiment of a display device manufacturing method according to principles of the invention.

FIG. 14 is a schematic diagram illustrating another embodiment of a display device manufacturing method according to principles of the invention.

A display device manufacturing method according to some embodiments is different from the display device manufacturing method according to the above-described embodiment in that when air is injected through the first air blower 250, the first nozzle 252 is oriented in a generally diagonal direction in plan view. Specifically, the first nozzle 252_2 of the first air blower 250 provided on one side in the second direction DR2 may inject air AL toward between the first nozzle 252_2 of the first air blower 250 provided at the other side in the second direction DR2 and the neighboring first nozzle 252_2. In the display device manufacturing method according to some embodiments, the air streams injected from the first nozzles 252_2 of the first air blowers 250 opposing each other may not intersect each other. In addition, the embodiments are not limited thereto, and similarly to the first nozzles 252_2, the air from the second nozzle 262_2 of the second air blower 260 may be injected diagonally so as not to intersect the air AL injected from the opposite second nozzle 262_2.

In the display device manufacturing method according to some embodiments, fumes FM may be generated along the cutting line CL during a cutting process of the target substrate PS which uses the laser beam LB. At this time, the generated fumes FM may interfere with the processing of the target substrate PS by blocking the laser beam LB, and thus they need to be removed. The fumes FM generated at the target substrate PS may be guided to the vicinity of the suction inlet IN of the suction unit 200 by the air AL injected from the air blowers 250 and 260. Therefore, the fumes FM guided to the vicinity of the suction inlet IN may be effectively removed by the negative pressure provided by the suction unit 200.

Figure 15:
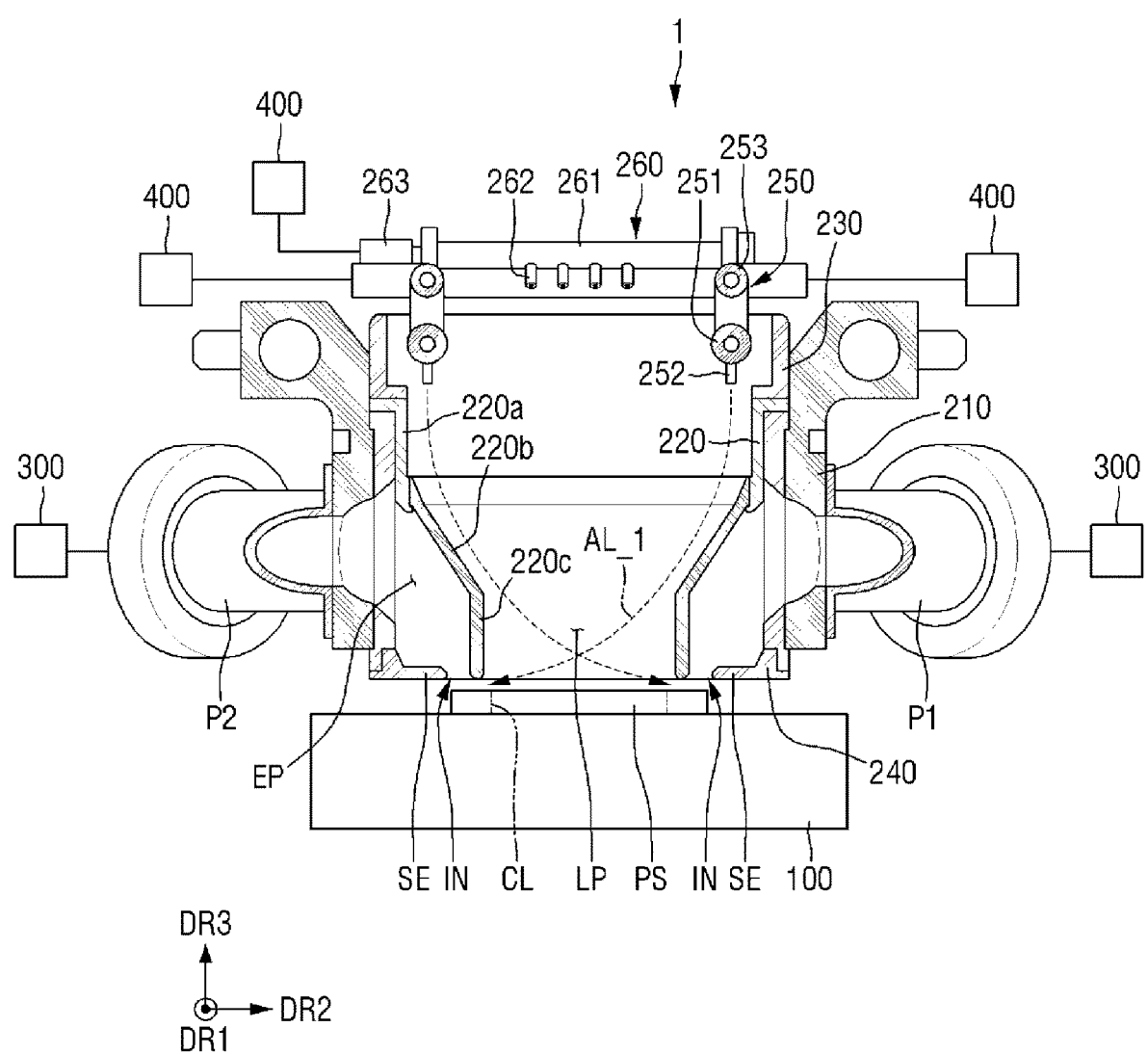
FIG. 15 is a schematic diagram illustrating yet another embodiment of a display device manufacturing method according to principles of the invention.

FIG. 15 is a schematic diagram illustrating yet another embodiment of a display device manufacturing method according to principles of the invention.

The display device manufacturing method according to some embodiments is different from the display device manufacturing method according to the above-described embodiment in that the nozzles 252 and 262 are directed to the other side in a third direction DR3. In the display device manufacturing method according to some embodiments, air AL_1 injected from each nozzle 252, 262 may be directed to the other side in the third direction DR3. An injection line AL_1 of FIG. 15 indicates a movement path of the air AL_1 injected from the first nozzle 252. The air AL_1 injected from the first nozzle 252 may move along the inner surface of the inclined sidewall 220*b* of the inner cup 220 and be sucked into the opposite suction inlet IN.

In the display device manufacturing method according to some embodiments, fumes FM may be generated along the cutting line CL during a cutting process of the target substrate PS which uses the laser beam LB. At this time, the generated fumes FM may interfere with the processing of the target substrate PS by blocking the laser beam LB, and thus they need to be removed. The fumes FM generated at the target substrate PS may be guided to the vicinity of the suction inlet IN of the suction unit 200 by the air AL_1 injected from the air blowers 250 and 260. Therefore, the fumes FM guided to the vicinity of the suction inlet IN may be effectively removed by the negative pressure provided by the suction unit 200.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An apparatus for manufacturing a display device, the apparatus comprising:
 a stage unit; and
 a suction unit located above the stage unit,
 wherein the suction unit comprises:
 a main body including an outer box with top and bottom openings and an inner cup disposed in the outer box;

a first air blower disposed above the main body and including a first main pipe extending in a first direction and a second air blower including a second main pipe extending in a second direction intersecting the first direction;

a lower plate coupled to a lower end of the outer box and including a through hole; and a suction inlet defined by an inner end of the lower plate defining the through hole and a lower end of the inner cup, wherein the suction inlet is opened downward.

2. The apparatus of claim 1, wherein the first air blower is provided as a pair of first air blowers, which are respectively disposed to oppose each other on one edge and another edge of the main body in the second direction, and the second air blower is provided as a pair of second air blowers, which are respectively disposed to oppose each other on one edge and the other edge of the main body in the first direction.

3. The apparatus of claim 2, wherein the first air blower includes a plurality of first nozzles disposed below the first air blower and arranged along the first direction, and the second air blower includes a plurality of second nozzles disposed below the second air blower and arranged along the second direction.

4. The apparatus of claim 3, wherein each of the first nozzle and the second nozzle is configured to have an adjustable inclination.

5. The apparatus of claim 3, wherein the first nozzle included in the first air blower disposed on one side in the second direction extends toward a lower end portion of the inner cup on the other side in the second direction, and the first nozzle included in the first air blower disposed on the other side in the second direction extends toward a lower end portion of the inner cup on one side in the second direction.

6. The apparatus of claim 3, wherein the first nozzles respectively included in the first air blowers opposing each other do not overlap each other in the second direction.

7. The apparatus of claim 2, wherein the first air blower and the second air blower are connected to an air supply device.

8. The apparatus of claim 1, wherein the suction unit further includes an exhaust passageway defined by an inner surface of the outer box, a top surface of the lower plate, and an outer surface of the inner cup.

9. The apparatus of claim 8, wherein the suction unit further includes a pipe having one side connected to the exhaust passageway and the other side connected to a dust collecting unit which provides a negative pressure.

10. The apparatus of claim 1, wherein the suction inlet is disposed to surround a lower end portion of the inner cup.

11. The apparatus of claim 1, wherein a lower end portion of the inner cup overlaps the lower plate in a thickness direction.

12. The apparatus of claim 1, further comprising:

a laser module disposed above the suction unit and configured to emit a laser beam; and an optical system configured to adjust a path of the laser beam.

* * * * *